(12) United States Patent
Lee et al.

(10) Patent No.: US 8,471,276 B2
(45) Date of Patent: Jun. 25, 2013

(54) ORGANIC LIGHT EMITTING DIODE DISPLAY

(75) Inventors: Seung-Mook Lee, Yongin (KR); Do-Young Kim, Yongin (KR); Sang-Woo Pyo, Yongin (KR); Tae-Min Kang, Yongin (KR); Hee-Seong Jeong, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/172,746

(22) Filed: Jun. 29, 2011

(65) Prior Publication Data
US 2012/0001207 A1    Jan. 5, 2012

(30) Foreign Application Priority Data

Jun. 30, 2010  (KR) .................. 10-2010-0062880

(51) Int. Cl.
*H01L 33/62*   (2010.01)

(52) U.S. Cl.
USPC .......... 257/89; 257/98; 257/99; 257/E33.061; 257/E33.064; 313/504

(58) Field of Classification Search
USPC ............................. 257/89, E33.064; 313/504
See application file for complete search history.

(56) References Cited

U.S. PATENT DOCUMENTS

| | | |
|---|---|---|
| 2003/0030766 A1 | 2/2003 | Kiguchi et al. |
| 2004/0160172 A1 | 8/2004 | Tyan et al. |
| 2005/0225232 A1* | 10/2005 | Boroson et al. ............. 313/504 |
| 2007/0052119 A1* | 3/2007 | Sakai et al. ................... 264/1.7 |
| 2009/0200922 A1 | 8/2009 | Lee et al. |
| 2010/0133994 A1* | 6/2010 | Song et al. .................... 313/504 |

FOREIGN PATENT DOCUMENTS

| | | |
|---|---|---|
| KR | 10-2003-0096029 A | 12/2003 |
| KR | 10-0684243 B1 | 2/2007 |
| KR | 10-2008-0063579 A | 7/2008 |

OTHER PUBLICATIONS

European Search Report dated Oct. 17, 2011 for European Application No. EP 11 17 1668.4 which shares priority of Korean Patent Application No. KR 10-2010-0062880 with captioned U.S. Appl. No. 13/172,746.

Extended European Search Report dated Mar. 8, 2012 for European Patent Application No. EP 11 17 1668.4 which shares priority of Korean Patent Application No. KR 10-2010-0062880 with captioned U.S. Appl. No. 13/172,746.

* cited by examiner

*Primary Examiner* — Minh-Loan T Tran
*Assistant Examiner* — Fazli Erdem
(74) *Attorney, Agent, or Firm* — Knobbe, Martens, Olson & Bear LLP (57) ABSTRACT

An organic light emitting diode (OLED) display is disclosed. In one embodiment, the OLED display includes i) a plurality of pixels comprising a blue light emitting region, a green light emitting region, and a red light emitting region on a substrate and formed by stacking a lower electrode, an organic layer, and an upper electrode. In one embodiment, the blue and green light emitting regions are formed in a microcavity structure, and the red light emitting region is formed in a non-microcavity structure.

20 Claims, 5 Drawing Sheets

ORGANIC LIGHT EMITTING DIODE DISPLAY

RELATED APPLICATIONS

This application claims priority to and the benefit of Korean Patent Application No. 10-2010-0062880 filed in the Korean Intellectual Property Office on Jun. 30, 2010, the entire contents of which are incorporated herein by reference.

BACKGROUND

1. Field

The described technology generally relates to an organic light emitting diode (OLED) display.

2. Description of the Related Technology

Among flat panel displays, an electroluminescence device uses an electro-luminescence (EL) phenomenon whereby light is generated when a predetermined electric field is applied to phosphor. EL devices are generally classified into inorganic or organic type according to the material used to form a light emitting layer. Since an organic EL device emits light across a broad color spectrum and has desirable characteristics such as high luminance and low driving voltage, it has received considerable attention for commercial applications.

In an organic light emitting diode (OLED), a pixel area defined by a plurality of scan lines and a plurality of data lines formed in a direction substantially vertical thereto implements each of red, green, and blue sub-pixels, thereby making it possible to configure a matrix of pixels into a full-color flat panel device.

In a typical OLED, a first electrode layer having a predetermined pattern is formed on the upper portion of a substrate including a red pixel area, a green pixel area, and a blue pixel area in order to implement red (R), green (G), and blue (B), respectively.

The organic layer including the light emitting layer is formed on the upper portion of the first electrode layer. The organic layer may include a hole injection layer (HIL), a hole transport layer (HTL), a hole blocking layer, an electron transport layer (ETL), and an electron injection layer (EIL) in addition to the light emitting layer. A second electrode layer is formed on the upper portion of the organic layer over the substrate.

In this case, the organic layer may be formed by a deposition method, an ink jet method, a laser thermal induced method, or the like.

SUMMARY

One inventive aspect is an organic light emitting diode display capable of making substantially uniform organic layers in thickness for, blue, green and red light emitting regions, while implementing full color.

Another aspect is an organic light emitting diode display including: a plurality of pixels defined by a blue light emitting region, a green light emitting region, and a red light emitting region on a substrate and formed by stacking a lower electrode, an organic layer, and an upper electrode, wherein the blue and green light emitting regions are formed in a microcavity structure and the red light emitting region is formed in a non-microcavity structure.

Another aspect is an organic light emitting diode display including: a substrate having a plurality of light emitting regions defined by a blue light emitting region, a green light emitting region, and a red light emitting region; a lower electrode formed in the blue and green light emitting regions, and formed by stacking a first transparent conductive layer, a semitransparent metal layer, and a second transparent conductive layer; and a lower electrode formed of a transparent conductive layer in the red light emitting region. Another aspect is an organic light emitting diode (OLED) display comprising: a plurality of pixels comprising a blue light emitting region, a green light emitting region, and a red light emitting region on a substrate and formed by stacking a lower electrode, an organic layer, and an upper electrode, wherein the lower electrode of the blue and green light emitting regions is formed of at least one transparent layer and at least one semitransparent layer and wherein the lower electrode of the red light emitting region is formed of only a transparent layer.

In the above display, the lower electrode of the red light emitting region is formed of one or more transparent conductive layers. In the above display, the lower electrode of the blue and green light emitting regions is formed of a first transparent conductive layer, a semitransparent metal layer, and a second transparent conductive layer which are sequentially formed. In the above display, the thickness of the first transparent conductive layer is from about 50 nm to about 150 nm and the thickness of the second transparent conductive layer is from about 10 nm to about 20 nm.

In the above display, the thickness of the semitransparent metal layer is from about 5 nm to about 20 nm. In the above display, the thickness of the organic layer is from about 50 nm to about 60 nm. In the above display, the organic layers formed on the blue light emitting region, the green light emitting region, and the red light emitting region include a blue emission layer, a green emission layer, and a red emission layer, respectively. In the above display, the organic layer further includes at least one of: a hole injection layer (HIL), a hole transport layer (HTL), a hole blocking layer and, an electron injection layer (EIL). In the above display, the thickness of the hole injection layer (HIL) and the hole transport layer (HTL) is from about 19 nm to about 36 nm. In the above display, the thickness of the organic layer in the red light emitting region is substantially the same as the thickness of the red right emitting layer or is about 60 nm.

The above display further comprises: a color filter or a color converting layer formed on the upper electrode of the red light emitting region. The above display further comprises: an encapsulation substrate bonded to the substrate and including the color filter or a color converting layer formed to correspond to the red light emitting region.

Another aspect is an organic light emitting diode (OLED) display comprising: a substrate having a plurality of light emitting regions which comprise a blue light emitting region, a green light emitting region, and a red light emitting region; a first lower electrode formed in the blue and green light emitting regions, and formed by stacking a first transparent conductive layer, a semitransparent metal layer, and a second transparent conductive layer; and a second lower electrode formed in the red light emitting region and formed of only a transparent conductive layer.

In the above display, an organic layer and an upper electrode are further formed on the lower electrodes. In the above display, the thickness of the first transparent conductive layer is from about 50 nm to about 150 nm and the thickness of the second transparent conductive layer is from about 10 nm to about 20 nm. In the above display, the thickness of the semitransparent metal layer is from about 5 nm to about 20 nm. In the above display, the thickness of the organic layer is from about 50 nm to about 60 nm.

Another aspect is an organic light emitting diode (OLED) display comprising: a plurality of pixels each of which comprises blue, red and green sub-pixels configured to emit blue, red and green light, respectively; a first lower electrode formed in the blue and green sub-pixels, wherein the first lower electrode comprises at least one transparent layer and at least one semitransparent layer; and a second lower electrode formed in the red sub-pixel and formed of a transparent conductive layer, wherein the second lower electrode does not include a semitransparent layer.

In the above display, the first lower electrode comprises i) a first transparent conductive layer, ii) a semitransparent metal layer and iii) a second transparent conductive layer which are sequentially formed. In the above display, the second lower electrode is formed of one or more transparent conductive layers.

DETAILED DESCRIPTION

Generally, in order to increase the color reproduction rate, e.g., the proportion of colors that can be generated with respect to a color gamut which humans can recognize, of an OLED display, a first electrode having an ITO/Ag/ITO structure is used to transmit a portion of emitted light and resonate another portion of the emitted light.

In this case, since the red area emits light having a longer wavelength than blue and green areas, the thickness of the organic layer in the red area should be formed to be thicker than that of the organic layer in the blue and green areas in order to generate the desired degree of microcavity. Therefore, the thickness of the organic layer formed in each light emitting region becomes non-uniform.

Hereinafter, an organic light emitting diode display according to an embodiment will be described more fully hereinafter with reference to the accompanying drawings. The disclosed embodiments mainly describe the case where a plurality of pixels defined by blue, green and red light emitting regions are formed on a substrate. Further, the disclosed embodiments describe, by way of example, an active matrix organic light emitting diode display; however, may be applied to a passive matrix organic light emitting diode display.

Figure 1:
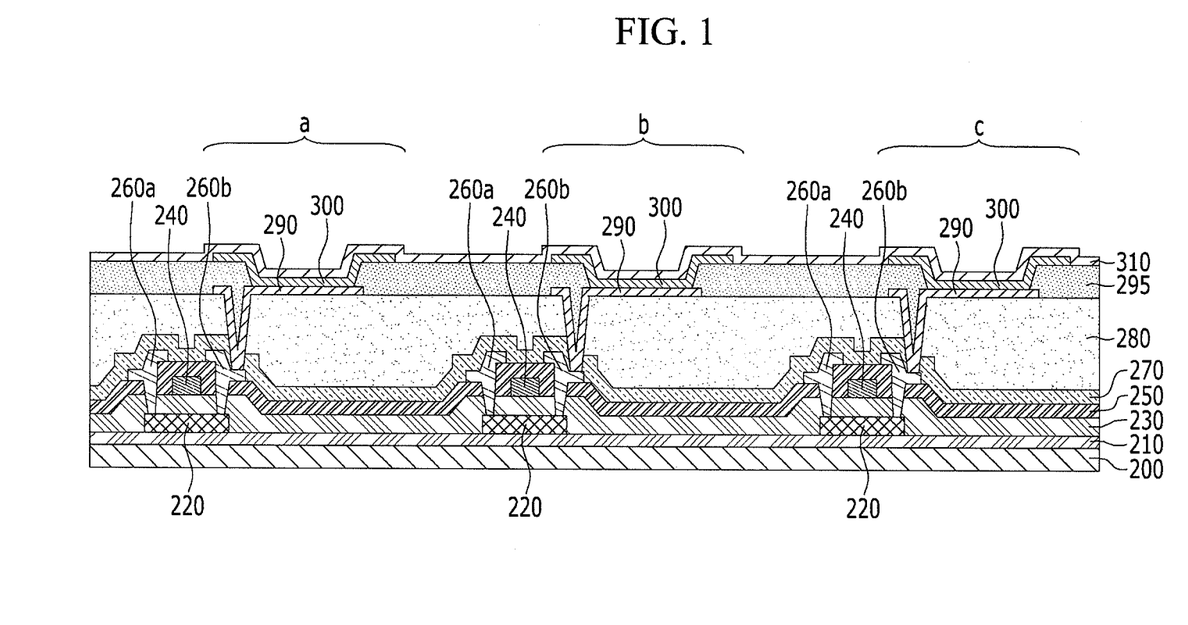
FIG. 1 is a cross-sectional view of an organic light emitting diode display according to an embodiment.

Referring to FIG. 1, a buffer layer 210 is formed over a substrate 200 and an amorphous silicon layer is formed on the buffer layer 210 by, for example, a deposition method such as PECVD, LPCVD, or the like. In this case, the substrate 200 may be an insulating substrate such as glass, quartz, sapphire, etc., and the buffer layer 210 prevents the amorphous silicon layer from being polluted by impurities diffused from the substrate 200.

The amorphous silicon layer may be crystallized by methods such as excimer laser annealing (ELA), sequential lateral solidification (SLS), metal induced crystallization (MIC) or metal induced lateral crystallization (MILC). The amorphous silicon layer may be patterned by a photolithography process to form a semiconductor layer 220 in a thin layer transistor area in a unit pixel.

Thereafter, a gate insulating layer 230 is formed over the substrate 200 including the semiconductor layer 220. The gate insulating layer 230 may be formed at least partially of silicon oxide, silicon nitride or may be formed in a stacked structure thereof.

Next, after a gate electrode material is applied to the upper portion of the gate insulating layer 230, it is etched to form the patterned gate electrode 240. The gate electrode 240 is formed to be partially overlapping with the semiconductor layer 220, and the semiconductor layer 220 area overlapping with the gate electrode 240 is defined as the channel area.

The gate electrode 240 may be formed of a single layer of an aluminum alloy of aluminum (Al) or aluminum-neodymium (Al—Nd) or of a multi-layer in which aluminum alloy is stacked on chromium (Cr) or molybdenum (Mo) alloy.

Next, an interlayer insulating layer 250 is formed over the surface. The interlayer insulating layer 250 may use a silicon nitride layer or a silicon oxide layer.

Next, a metal layer (not shown) is formed on an interlayer insulating layer 250 and is then patterned, thereby forming source/drain electrodes 260a and 260b. The source/drain electrodes 260a and 260b are electrically connected to the source area and the drain area of the semiconductor layer 220 through a contact hole formed by partially etching the gate insulating layer 230 and the interlayer insulating layer 250.

The metal layer forms a single layer selected from a group of Mo, W, MoW, AlNd, Ti, Cu, Cu alloy, Al, Al alloy, Ag and Ag alloy, etc. Alternatively, in order to reduce the wire resistance, the metal layer may be formed of one stacking structure selected from one group consisting of a two-layer structure of Mo, Cu, Al or Ag that is a low resistance material or a multi-layer structure of two layer or more.

Then, the silicon nitride layer, the silicon oxide layer or the stacking structure thereof are deposited over the surface at a predetermined thickness to form the protective layer 270 and then a planarization layer 280 is formed on the protective layer 270. The planarization layer 280 may be formed at least partially of polyamide, benzocyclobutyne based resin, and acrylate.

Thereafter, the protective layer 270 and the planarization layer 280 are partially etched to form a via hole that exposes any one of source/drain electrodes 260a and 260b and the lower electrode 290 formed on the planarization layer 280 is electrically connected to any one of the source/drain electrodes 260a and 260b exposed through a via hole.

The lower electrode 290 is formed in a blue light emitting region (a), a green light emitting region (b), a red light emitting region (c), respectively, and the position in which the light emitting region is formed is not limited thereto.

A pixel defining layer 295 having an opening is formed on the upper of the lower electrode 290 to expose a portion of the lower electrode 290 through the opening and to form the organic layer 300 on the lower electrode 290 that is opened.

The pixel defining layer 295 may be formed at least partially of polyimide, benzocyclobutene series resin, spin on glass (SOG), and acrylate.

Then, the upper electrode 310 is formed over the substrate 200 to complete the organic light emitting diode. The upper electrode 310 may be formed at least partially of Li, Ca, LiF/Ca, LiF/Al, Al, Mg and an alloy thereof.

Figure 2A:
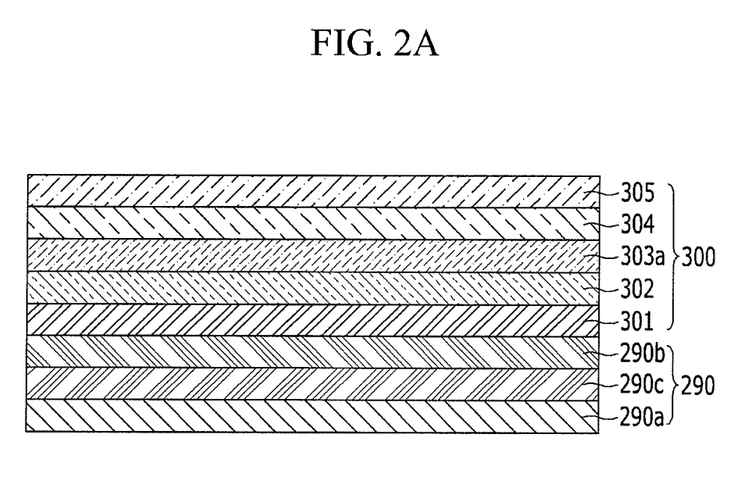
FIG. 2A is a cross-sectional view showing in detail a structure of a lower electrode and an organic layer in a blue light emitting region.

Referring to FIG. 2A, the lower electrode 290 formed in the blue light emitting region (a) is formed by sequentially stacking the first transparent conductive layer 290a, a semitransparent metal layer 290c, and the second transparent conductive layer 290b and the organic layer 300 is formed on the lower electrode 290. The lower electrode 290 of the blue light emitting region (a) may include at least one transparent conductive layer and at least one semitransparent metal layer. This applies to the lower electrode 290 formed in the green light emitting region (b).

The first and second transparent conductive layers 290a and 290b may be formed at least partially of indium tin oxide (ITO), an indium zinc oxide (IZO), tin oxide (To), and zinc oxide (ZnO). The first transparent conductive layer 290a substantially serves as an anode and the second transparent conductive layer 290b serves to match work function, thereby completing the lower electrode 290.

In one embodiment, the first transparent conductive layer 299a has good light efficiency of blue, green, red within a thickness of about 50 nm to about 150 nm of blue, green, and red and thus, the first transparent conductive layer 290a is formed at the thickness of about 50 nm to about 150 nm.

In one embodiment, the second transparent conductive layer 290b is formed at about 10 nm or more to sufficiently perform a role of the anode and since it is considered together with the thickness of the organic layer, it may be formed at about 30 nm or less in order to maximize the microcavity effect of light generated from the organic light emitting layer.

The semitransparent metal layer 290c may be formed at least partially of Ag, Al, Ni, Pt and Pd. In one embodiment, the thickness of the semitransparent metal layer 290c is from about 5 nm to about 20 nm. This range may provide an optimum balance between light transmittance and the functionality as a metal electrode. However, the thickness of the semitransparent metal layer 290c may be less than about 5 nm or greater than about 20 nm.

The organic layer 300 may further include at least one selected from one group consisting of the blue light emitting layer 303a, the hole injection layer 301 positioned between the blue light emitting layer 303a and the lower electrode 290 other than the blue light emitting layer 303a, the hole blocking layer 304 positioned on the hole transport layer 302 and the blue light emitting layer 303a and the electron injection layer 305. In this configuration, the organic layer 300 may be formed at the thickness of about 50 nm to about 60 nm in consideration of the light emitting luminance and the color reproduction rate. Alternatively, the thickness of the organic layer 300 may be less than about 50 nm or greater than about 60 nm.

In this case, the thickness of the hole injection layer 301 and the hole transport layer 302 between the lower electrode 290 and the blue light emitting layer 303a maximizes the luminance and the microcavity effect, such that they may be formed at a thickness of about 19 nm to about 36 nm in order to maximize the microcavity effect. Again, the thickness of the layers 301 and 302 may be less than about 19 nm or greater than about 36 nm.

Figure 2B:
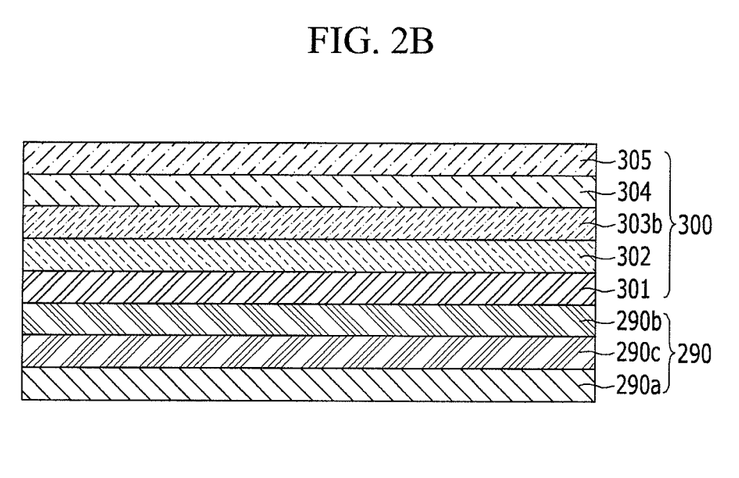
FIG. 2B is a cross-sectional view showing in detail a lower electrode and an organic layer in a green light emitting region.

Referring to FIG. 2B, the lower electrode 290 formed in the green light emitting region (b) is formed by sequentially stacking the first transparent conductive layer 290a, the semitransparent metal layer 290c and the second transparent conductive layer 290b and the organic layer 300 is formed on the lower electrode 290. The description for the layers 290a-290c and organic layer 300 of the blue light emitting region (a) applies to those of the green light emitting region (b), except that in FIG. 2B, the organic layer 300 includes a green light emitting layer 303b instead of the blue light emitting layer 303a.

Figure 2C:
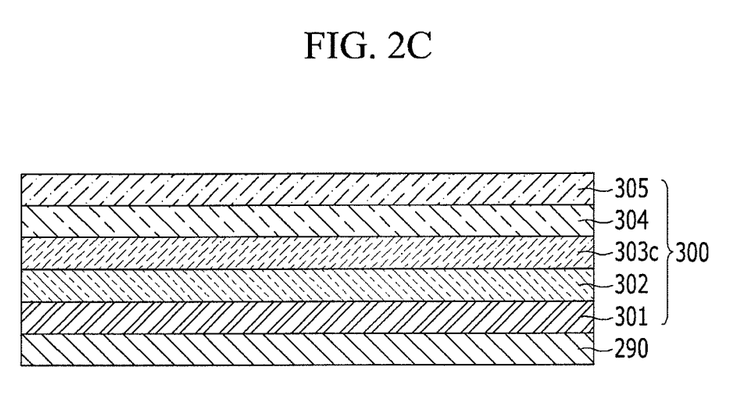
FIG. 2C is a cross-sectional view showing in detail a lower electrode and a structure of an organic layer in a red light emitting region.

Referring to FIG. 2C, the lower electrode 290 formed in the red light emitting region (c) is formed of the transparent conductive layer and the organic layer 300 is formed on the lower electrode 290. The lower electrode 290 may be formed in a single layer or a multilayer structure of the transparent conductive layer. The transparent conductive layer may be formed at least partially of indium tin oxide (ITO), an indium zinc oxide (IZO), tin oxide (To), and zinc oxide (ZnO) and serves as the anode of the lower electrode 290.

The thickness of the lower electrode 290 is determined together with the thickness of the organic layer 300 in order to increase the light emitting luminance and the color reproduction rate.

The organic layer 300 includes the red light emitting layer 303c and may further include at least one selected from one group consisting of the hole injection layer 301 positioned between the lower electrode 290 and the red light emitting layer 303c, the hole blocking layer 304 positioned on the hole transport layer 302 and the red light emitting layer 303c and the electron injection layer 305.

In this case, the organic layer 300 may be formed at the thickness of about 50 nm to about 60 nm in consideration of the light emitting luminance, the color reproduction rate, the thickness of the organic layers of the blue light emitting region and the green light emitting region, etc. However, the red light emitting region can sufficiently satisfy the color reproduction rate by including only the red light emitting layer and thus, may be formed at the thickness of the red light emitting layer to the thickness of about 60 nm, but is not limited thereto. However, when the red light emitting layer is about 33.6 nm to about 35.6 nm, the light emitting efficiency and the color reproduction rate is excellent, but is not limited thereto.

In this case, the thickness of the hole injection layer 301 and the hole transport layer 302 between the lower electrode 290 and the red light emitting layer 303c maximizes the microcavity effect, such that they may be formed at a thickness of about 19 nm to 36 nm in order to increase the emission luminance and the color reproduction rate.

According to the above description with reference to FIGS. 2A to 2C, the lower electrode formed in the blue light emitting region and the green light emitting region has a structure of the first transparent conductive layer/semitransparent metal layer/second transparent conductive layer, but the lower electrode positioned in the red light emitting region is formed of the transparent conductive layer. In other words, the microcavity structure is formed in the blue light emitting region and the green light emitting region, but the non-microcavity structure is formed in the red light emitting region.

According to a conventional device (not necessarily prior art), in order to form the microcavity structure, the thickness of the organic layer of the red light emitting region is thicker than the thickness of the organic layer of the blue light emitting region and the green light emitting region. In one embodiment, when the red light emitting region forms the non-microcavity structure, the thickness of the organic layers of the blue light emitting region and the green light emitting region is uniform by controlling the thickness of the organic layer of the red light emitting region.

Figure 3:
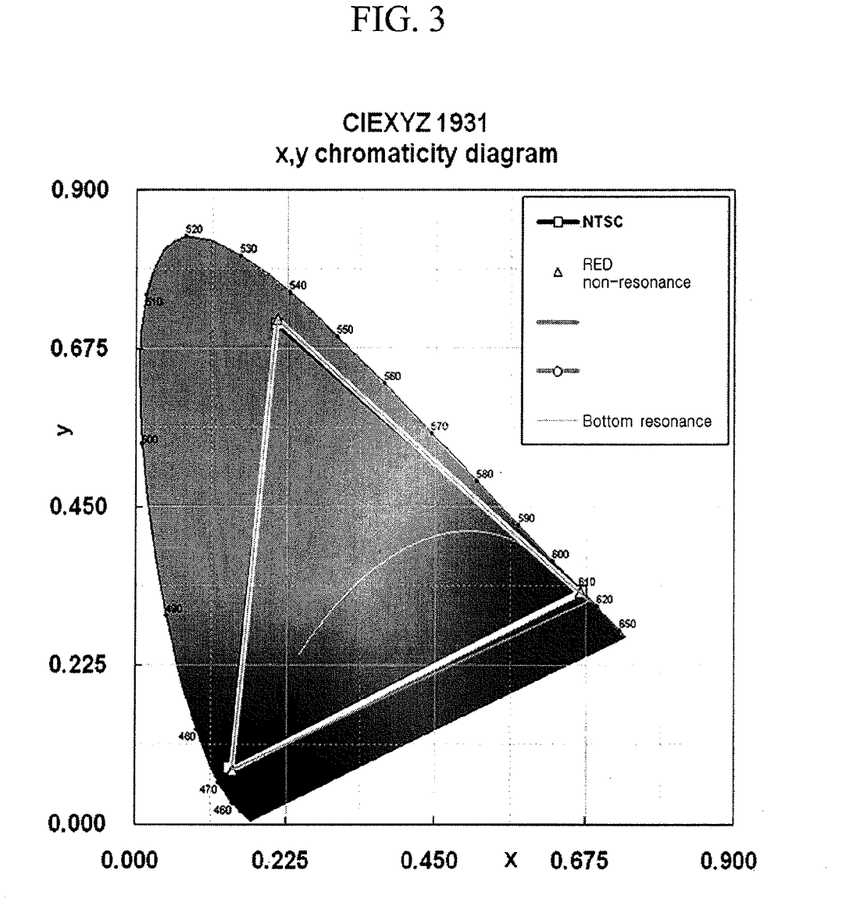
FIGS. 3 and 4 are CIE-based color coordinates for explaining a color reproduction rate when the red light emitting region is formed in a non-microcavity structure.
Figure 4:
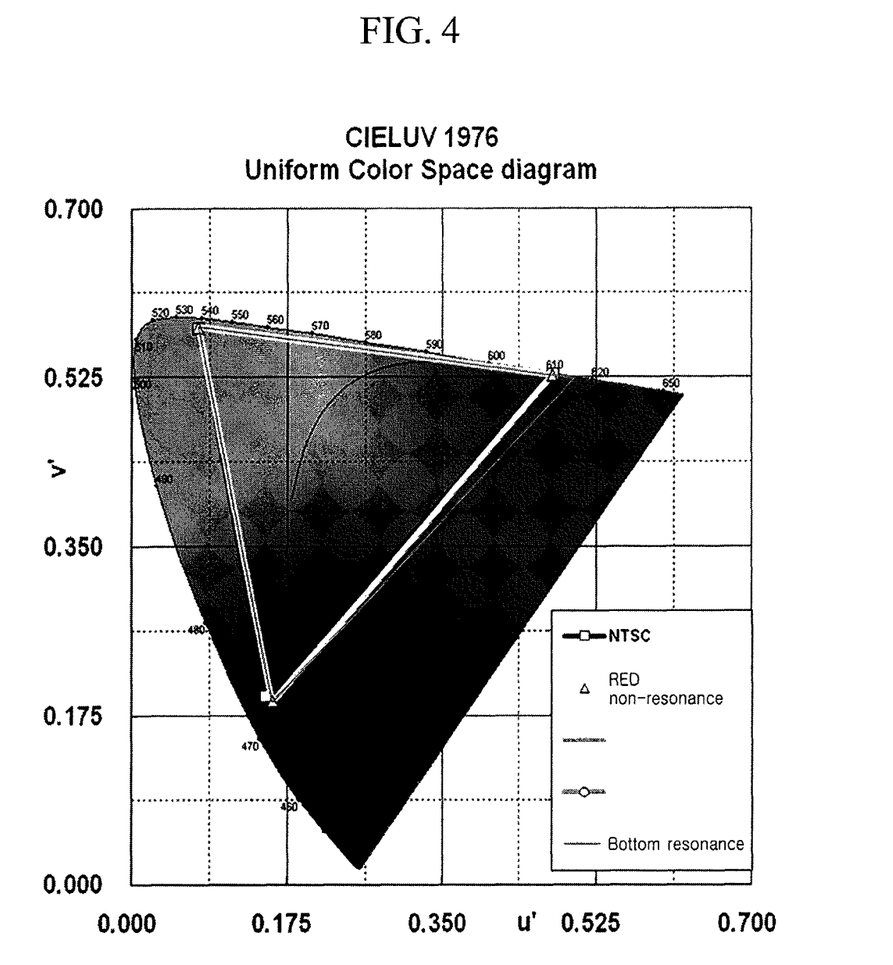

FIGS. 3 and 4 are CIE-based color coordinates for explaining a color reproduction rate when the red light emitting region is formed in a non-microcavity structure, wherein FIG. 3 shows a color coordinate system according to CIEXYZ 1931 (color space) and FIG. 4 shows a color coordinate system according to CIELUV 1976 (color space).

The following Table 1 shows results obtained by comparing the color coordinate, the color reproduction area, and the color reproduction rate with the NTSC when the red light emitting region is formed in the non-microcavity structure in the color coordinate of FIG. 3 and the following Table 2 shows results obtained by comparing the color coordinate, the color reproduction rate, and the color reproduction rate with the NTSC when the red light emitting region is formed in the non-microcavity structure in the color coordinate of FIG. 4.

TABLE 1

| | color coordinate (x, y) | | | Color reproduction area Color reproduction | Color reproduction rate Color reproduction |
|---|---|---|---|---|---|
| | blue | green | red | area | rate |
| Comparative Example | (0.140, 0.080) | (0.210, 0.710) | (0.670, 0.330) | 0.158 | 100% |
| embodiment | (0.144, 0.077) | (0.210, 0.717) | (0.668, 0.329) | 0.159 | 100.7% |

TABLE 2

| | color coordinate (u', v') | | | Color reproduction area Color reproduction | Color reproduction rate Color reproduction |
|---|---|---|---|---|---|
| | blue | green | red | area | rate |
| Comparative Example | (0.152, 0.196) | (0.076, 0.576) | (0.477, 0.528) | 0.074 | 100% |
| embodiment | (0.159, 0.190) | (0.075, 0.577) | (0.476, 0.528) | 0.075 | 101.4% |

In Tables 1 and 2, the color reproduction area represents the color representation range. The higher the number, the wider the color representation range becomes and the color reproduction rate relatively represents the color reproduction rate of the embodiment based on the NTSC reference of 100%.

Referring to FIG. 3 and Table 1, when the red light emitting region is formed in the non-microcavity structure, the color reproduction area is 0.159, which is higher than 0.158 that is a reference of NTSC (National Television System Committee) and the color reproduction rate is 100.7%, which is relatively higher than the NTSC reference.

In addition, referring to FIG. 4 and Table 2, when the red light emitting region has the non-microcavity structure, it can be appreciated that the color representation area is 0.075, which is higher than 0.074 that is the NTSC reference and the color reproduction rate is 101.4%, which is relatively higher than that of NTSC reference.

Therefore, as in the above embodiment, even though the red light emitting region has the non-microcavity structure, it can be appreciated that the color reproduction rate satisfies the NTSC reference.

Meanwhile, although not shown in FIG. 1, in order to increase the color reproduction rate of the red light emitting region, it is possible to form the color filter or the color converting layer in the red light emitting region.

The color filter or the color converting layer may be implemented by applying the method for forming the generally used color filter or color converting layer in the current display device field, may be formed on the upper electrode 310 in the red light emitting region, and may be formed to correspond to the red light emitting region on an encapsulation substrate (not shown) bonded to the substrate 200 of FIG. 1.

According to at least one of the disclosed embodiments, the blue and green light emitting regions are formed in the microcavity structure and the red light emitting region is formed in the non-microcavity structure, such that the thickness of the organic layer of the red light emitting region is controlled to make the thickness of the blue light emitting region and the green light emitting region uniform, thereby making it possible to making the thickness of the organic layers of each light emitting region uniform while implementing the full color.

It is to be understood that the disclosed embodiments are not considered limiting and cover various modifications and equivalent arrangements included within the spirit and scope of the appended claims.

What is claimed is:

1. An organic light emitting diode (OLED) display comprising:
   a plurality of pixels comprising a blue light emitting region, a green light emitting region, and a red light emitting region on a substrate and formed by stacking a lower electrode, an organic layer, and an upper electrode,
   wherein the blue and green light emitting regions are formed in a microcavity structure wherein the red light emitting region is formed in a non-microcavity structure,
   and wherein each of the lower electrodes of the blue and green light emitting regions is formed of at least one transparent layer and at least one semitransparent layer and wherein the lower electrode of the red light emitting region is formed of only a transparent layer.

2. The organic light emitting diode display of claim 1, wherein:
   the lower electrode of the red light emitting region is formed of one or more transparent conductive layers.

3. The organic light emitting diode display of claim 1, wherein:
   each of the lower electrodes of the blue and green light emitting regions is formed of a first transparent conductive layer, a semitransparent metal layer, and a second transparent conductive layer which are sequentially formed.

4. The organic light emitting diode display of claim 3, wherein:
   the thickness of the first transparent conductive layer is from about 50 nm to about 150 nm and the thickness of the second transparent conductive layer is from about 10 nm to about 20 nm.

5. The organic light emitting diode display of claim 3, wherein:
   the thickness of the semitransparent metal layer is from about 5 nm to about 20 nm.

6. The organic light emitting diode display of claim 1, wherein:
   the thickness of the organic layer is from about 50 nm to about 60 nm.

7. The organic light emitting diode display of claim 1, wherein:
   the organic layers formed on the blue light emitting region, the green light emitting region, and the red light emitting region include a blue emission layer, a green emission layer, and a red emission layer, respectively.

8. The organic light emitting diode display of claim 7, wherein:
the organic layer further includes at least one of: a hole injection layer (HIL), a hole transport layer (HTL), a hole blocking layer and, an electron injection layer (EIL).

9. The organic light emitting diode display of claim 8, wherein:
the thickness of the hole injection layer (HIL) and the hole transport layer (HTL) is from about 19 nm to about 36 nm.

10. The organic light emitting diode display of claim 7, wherein:
the thickness of the organic layer in the red light emitting region is substantially the same as the thickness of the red light emitting layer or is about 60 nm.

11. The organic light emitting diode display of claim 1, further comprising:
a color filter or a color converting layer formed on the upper electrode of the red light emitting region.

12. The organic light emitting diode display of claim 1, further comprising:
an encapsulation substrate bonded to the substrate and including a color filter or a color converting layer formed to correspond to the red light emitting region.

13. An organic light emitting diode (OLED) display comprising:
a substrate having a plurality of light emitting regions which comprise a blue light emitting region, a green light emitting region, and a red light emitting region;
a first lower electrode formed in the blue and green light emitting regions, and formed by stacking a first transparent conductive layer, a semitransparent metal layer, and a second transparent conductive layer; and
a second lower electrode formed in the red light emitting region and formed of only a transparent conductive layer,
wherein an organic layer and an upper electrode are further formed on the lower electrodes.

14. The organic light emitting diode display of claim 13, wherein:
the thickness of the first transparent conductive layer is from about 50 nm to about 150 nm and the thickness of the second transparent conductive layer is from about 10 nm to about 20 nm.

15. The organic light emitting diode display of claim 13, wherein:
the thickness of the semitransparent metal layer is from about 5 nm to about 20 nm.

16. The organic light emitting diode display of claim 13, wherein:
the thickness of the organic layer is from about 50 nm to about 60 nm.

17. An organic light emitting diode (OLED) display comprising:
a plurality of pixels each of which comprises blue, red and green sub-pixels configured to emit blue, red and green light, respectively;
a first lower electrode formed in the blue and green sub-pixels, wherein the first lower electrode comprises at least one transparent layer and at least one semitransparent layer; and
a second lower electrode formed in the red sub-pixel and formed of a transparent conductive layer, wherein the second lower electrode does not include a semitransparent layer.

18. The organic light emitting diode display of claim 14, wherein the first lower electrode comprises i) a first transparent conductive layer, ii) a semitransparent metal layer and iii) a second transparent conductive layer which are sequentially formed.

19. The organic light emitting diode display of claim 14, wherein the second lower electrode is formed of one or more transparent conductive layers.

20. The organic light emitting diode display of claim 1, wherein each of the blue, green and red light emitting regions has a separate organic layer.

* * * * *